(12) United States Patent
Tennebroek et al.

(10) Patent No.: US 9,994,730 B2
(45) Date of Patent: Jun. 12, 2018

(54) POLYMERIC COMPOSITION

(71) Applicant: DSM IP ASSETS B.V., Heerlen (NL)

(72) Inventors: Ronald Tennebroek, Echt (NL); Ilse Van Casteren, Echt (NL)

(73) Assignee: DSM IP ASSETS B.V., Heerlen (NL)

( * ) Notice: Subject to any disclaimer, the term of this patent is extended or adjusted under 35 U.S.C. 154(b) by 0 days. days.

(21) Appl. No.: 15/104,650

(22) PCT Filed: Dec. 19, 2014

(86) PCT No.: PCT/EP2014/078842
§ 371 (c)(1),
(2) Date: Jun. 15, 2016

(87) PCT Pub. No.: WO2015/092005
PCT Pub. Date: Jun. 25, 2015

(65) Prior Publication Data
US 2016/0319153 A1 Nov. 3, 2016

(30) Foreign Application Priority Data
Dec. 19, 2013 (EP) ..................................... 13198351

(51) Int. Cl.
| | | |
|---|---|---|
| *C09D 175/08* | (2006.01) |
| *C08G 18/75* | (2006.01) |
| *C23C 16/56* | (2006.01) |
| *C08G 18/34* | (2006.01) |
| *C08G 18/48* | (2006.01) |
| *C08G 18/67* | (2006.01) |
| *C08G 18/12* | (2006.01) |
| *C08G 18/73* | (2006.01) |
| *C08G 18/08* | (2006.01) |
| *C09D 175/16* | (2006.01) |

(52) U.S. Cl.
CPC ....... *C09D 175/08* (2013.01); *C08G 18/0823* (2013.01); *C08G 18/12* (2013.01); *C08G 18/348* (2013.01); *C08G 18/4854* (2013.01); *C08G 18/673* (2013.01); *C08G 18/73* (2013.01); *C08G 18/755* (2013.01); *C09D 175/16* (2013.01); *C23C 16/56* (2013.01)

(58) Field of Classification Search
CPC .. C08G 18/12; C08G 18/672; C08G 18/0823; C08G 18/302; C08G 18/3231; C08G 18/6692; C08G 18/348; C08G 18/4854; C08G 18/73; C08G 18/755; C09D 175/04; C09D 175/08; C09D 175/16; C23C 16/56
USPC .................. 428/423.1; 528/59; 427/551, 553
See application file for complete search history.

(56) References Cited

U.S. PATENT DOCUMENTS

2006/0251896 A1   11/2006   Ferencz et al.
2009/0270581 A1   10/2009   Tielemans et al.

FOREIGN PATENT DOCUMENTS

DE      10 2009 008950      8/2010

OTHER PUBLICATIONS

International Search Report for PCT/EP2014/078842 dated Mar. 11, 2015, 3 pages.
Written Opinion of the ISA for PCT/EP2014/078842 dated Mar. 11, 2015, 4 pages.

*Primary Examiner* — Thao T Tran
(74) *Attorney, Agent, or Firm* — Nixon & Vanderhye P.C.

(57) ABSTRACT

The present invention relates to a radiation curable aqueous coating composition comprising a dispersion of a chain extended polyurethane which dispersion comprises (a) a polyurethane-urea polymer comprising (i) acryloyl groups present in an amount of at least 2.0 mmol per g of the polyurethane-urea polymer; and (ii) urea groups present in an amount of at least 0.35 milli-equivalents (meq) per g of the polyurethane-urea polymer; (b) optionally a multifunctional ethylenically unsaturated compound unreactive towards isocyanates, in an amount, where present, of up to 40% by weight of components (a) and (b); and (c) a neutralizing agent; where the polyurethane-urea polymer (component (a)) is obtained by (I) the reaction of at least the following polyurethane precursors: at least one polyisocyanate (a1), two or more polyols (a2) and at least one isocyanate reactive compound (a3) to obtain a polyurethane prepolymer, where the isocyanate and hydroxy groups on the polymer precursors (a1), (a2) and (a3) are present in a respective mole ratio (NCO to OH) of at least 1.35, and (II) by reacting the polyurethane prepolymer with an active hydrogen chain extending compound and optionally with water to obtain the polyurethane-urea polymer (a), where (a1) the amount of polyisocyanates (a1) is from 10 to 80% by weight; (a2) the two or more polyols being an Anionic Polyol A, a Polyether Polyol B and optionally a High MW NCO-Reactive Polyol C and optionally a Low MW NCO-Reactive Polyol D; (a3) the isocyanate reactive compounds are compounds having an average of less than 1.2 groups reactive towards isocyanate and an average of at least one acryloyl group, the compounds being other than (a2A), (a2B), (a2C) and (a2D) and where the amount of isocyanate reactive compound is from 5 to 60% by weight; where the weight % of components (a1), (a2A), (a2B), (a2C), (a2D), (a3) and (b) are calculated based on the total of components (a) and (b) being 100%.

15 Claims, No Drawings

POLYMERIC COMPOSITION

This application is the U.S. national phase of International Application No. PCT/EP2014/078842 filed 19 Dec. 2014 which designated the U.S. and claims priority to EP Patent Application No. 13198351.2 filed 19 Dec. 2013, the entire contents of each of which are hereby incorporated by reference.

The present invention relates to the field of radiation curable polyurethanes.

Radiation curable polyurethane dispersions (PUDs) are widely used to produce materials (such as coatings, inks, adhesives and/or composites) that are subsequently cured by radiation. Such radiation cured coatings exhibit very good properties on numerous substrates like wood, plastic, concrete, metal, glass and/or textiles. The structure and functionality of the radiation curable polyurethane dispersion is known to govern factors such as the speed of cure, the extent of crosslinking and the final properties of the coating (especially properties such as flexibility, hardness, adhesion, scratch resistance and/or chemical resistance).

Without wishing to be bound by any mechanism it is believed that polyurethanes that have domains of hard urethane and urea moieties that are strongly bound together via hydrogen bounds and radiation curable crosslinking groups give the coating its hardness and resistance. It is also believed that the softer segments of the polyurethane impart flexibility. It is understood that a radiation cured coating will become harder and more rigid as the number of radiation curable groups (such as acrylic double bonds) increases. In general, chemical resistance and solvent resistance follow a similar trend, increasing with higher crosslink density.

However, it has been found that as crosslink density continues to increase beyond a certain point, flexibility is rapidly lost as the radiation curable network within the polyurethane becomes too dense. For many substrates (such as wood) it is important that a coating also retains good flexibility to tolerate expansion and contraction of the underlying substrate with changes in temperature and relative humidity. Excellent flexibility is also important for applications such as resilient flooring where the coated substrates are handled and stored on rolls often at low temperatures. In addition radiation curable coatings for floors should be able to resist compression well (e.g. from high heels or office furniture) and be less prone to show stress whitening during use.

Various attempts have been made to provide improved radiation curable coatings having both a high cross-link density (and thus correspondingly good hardness and resistance) but also combined with good flexibility. To date none has been very successful.

Flexibility can be enhanced by increasing the average molecular weight of the polymer regions between the crosslink bonds (denote as 'Mc'). For water based polyurethanes Mc can be increased by raising the concentration of the (soft) polymeric polyol used to prepare the polyurethane. Unfortunately this has been found to be unsatisfactory as it significantly lowers the resistance of the coating to staining.

US 2009-270581 (Cytec) relates to aqueous radiation-curable polyurethane dispersions (PUD) designed for hard coatings that are also stain and scratch resistant. The PUD is obtained from a (meth)acrylated polyurethane pre-polymer (A) made by reacting (i) a polyisocyanate; (ii) an optional polyol; (iii) a hydrophilic compound reactive with isocyanate (NCO) to make the pre-polymer A water dispersible; (iv) a (meth)acrylate with two groups that react with NCO; (v) a (meth)acrylate with only one group that reacts with NCO; and (B) optionally an ethylenically unsaturated compound. These compositions have a minimum amount of the (meth)acrylate and (optional) polymerisable ethylenic groups of 3 meq per total weight of the composition in grams. The proportion of 'in-chain' C=C groups is high resulting in a low Mc and the NCO to OH ratio in Examples 1 to 16 ranges from 1.06 to 1.16.

U.S. Pat. No. 6,509,411 (DuPont) (=WO2000-34397) describes aqueous PUDs which are not chain extended and are used for coating by electro-deposition at an anode. The PUD comprises (a1)) an anionically modified polyurethane (meth)acrylate with terminal C=C bonds; and (a2) a reactive thinner with at least two ethylenically unsaturated (meth)acrylic double bonds. Component (a1) comprises (1) at least one ethylenically unsaturated (meth)acrylate and (2) an NCO fucntional anionically modified polyurethane prepolymer made from i) aliphatic, cycloaliphatic, araliphatic or aromatic polyisocyanate, ii) polyol from polyester diols, polyether diols, polycarbonate diols, and dimer fatty alcohols having Mn 400 to 5000, iii) compound having one anionic group and two NCO reactive groups and iv) a low-molecular weight polyol of Mn 60 to 400. Urethane, urea, amide, and/or ester groups bind the terminal C=C groups (I) to the NCO functional prepolymer (2) and the resultant prepolymer (a1) is further reacted with a compound having a NCO reactive group but no terminal C=C bonds. The amount of (meth)acrylic double bonds in the PUD dispersion is given as 1.3-9.3 mmol C=C/g solids (as measured by a bromine number of 20 to 150 g bromine/100 g solids).

It is an object of the invention to solve some or all of the problems described herein.

Surprisingly the applicant has found that in one embodiment of the invention preparing radiation curable chain extended polyurethanes from soft linear polyols that have a small block length produces coatings having an improved balance of high cross-link density and flexibility which results in non-brittle coating films with very high resistance levels.

Therefore broadly in accordance with the present invention there is provided a radiation curable aqueous coating composition comprising a dispersion of a chain extended polyurethane which dispersion comprises
 (a) a polyurethane-urea polymer comprising:
  (i) acryloyl groups present in an amount of at least 2.0 mmol per g of the polyurethane-urea polymer; and
  (ii) urea groups present in an amount of at least 0.35 milli-equivalents (meq) per g of the polyurethane-urea polymer;
 (b) optionally a multifunctional ethylenically unsaturated compound unreactive towards isocyanates, in an amount, where present, of up to 40% by weight of components (a) and (b); and
 (c) a neutralizing agent;
 where the polyurethane-urea polymer (component (a)) is obtained by (I) the reaction of at least the following polyurethane precursors: at least one polyisocyanate (a1), two or more polyols (a2) and at least one isocyanate reactive compound (a3) to obtain a polyurethane prepolymer, where the isocyanate and hydroxy groups on the polymer precursors (a1), (a2) and (a3) are present in a respective mole ratio (NCO to OH) of at least 1.35, and (II) by neutralizing the polyurethane prepolymer and reacting the neutralized polyurethane prepolymer with an active hydrogen chain extending compound and optionally with water to obtain the polyurethane-urea polymer (a), where (a1) the amount of polyisocyanates (a1) is from 10 to 80% by weight;

(a2) the two or more polyols being an Anionic Polyol A, a Polyether Polyol B and optionally a High MW NCO-Reactive Polyol C and optionally a Low MW NCO-Reactive Polyol D where;

(a2A) the Anionic Polyol A is at least one isocyanate-reactive polyol comprising at least one anionic or potentially anionic dispersing group and where the amount of Anionic Polyol A is from 1 to 15% by weight;

(a2B) the Polyether Polyol B is at least one isocyanate reactive polyether polyol with a number average molecular weight (Mn) from 500 to 2000 Daltons, where Polyether Polyol B is other than Anionic Polyol A and where the amount of Polyether Polyol B is from 3 to 30% by weight;

(a2C) the optional High MW NCO-Reactive Polyol C is at least one isocyanate reactive polyol with a number average molecular weight (Mn) of at least 500 Daltons; where the High MW NCO-Reactive Polyol C is other than Anionic Polyol A and Polyether Polyol B and where the amount of High MW NCO-Reactive Polyol C (where present) is up to 20% by weight;

(a2D) the optional Low MW NCO-Reactive Polyol D is at least one isocyanate reactive polyol with a number average molecular weight (Mn) less than 500 Daltons; where the low MW NCO-Reactive Polyol D is other than Anionic Polyol A, Polyether Polyol B and High MW NCO-Reactive Polyol C and where the amount of Low MW NCO-Reactive Polyol D (where present) is up to 20% by weight;

(a3) the isocyanate reactive compounds are compounds having an average of less than 1.2 groups reactive towards isocyanate and an average of at least one acryloyl group, the compounds being other than (a2A), (a2B), (a2C) and (a2D) and where the amount of isocyanate reactive compound is from 5 to 60% by weight;

where the weight % of components (a1), (a2A), (a2B), (a2C), (a2D), (a3) and (b) are calculated based on the total of components (a) and (b) being 100%.

Compared to prior art PUDs such as those exemplified in US 2009-270581 (Cytec), the components to produce the PUDs of the present invention have a higher ratio of NCO to OH than the prior art. Thus PUDs of the present invention will also contain a higher content of urethane and urea groups compared to these prior art PUDs. So it is surprising that nevertheless the PUDs of the invention can still form coatings with a good balance of both cross-link density and flexibility.

In contrast to the compositions described in WO2000-34397 (Du Pont) the PUDs of the present invention are chain extended. The example described in DuPont is prepared from a linear polyester diol with a hydroxy value of 106 mg KOH/g (corresponding to a molecular weight of 1060 Daltons). Du Pont teaches the reader to add mono hydroxy functional (acrylate) during preparation of the polyurethane. This acrylate reacts with all the isocyanate groups so that when the polyurethane is dispersed in water no NCO functionality remains. Thus no chain extension can occur as neither the water nor diamine can further react with the polyurethane. The polyester content of the prepolymer described in DuPont is high (44%). These polyester diols produce PUDs which are brittle and have a low concentration (2.75 meq/g) of C=C bonds. The DuPont polymers are prepared sequentially and not all ingredients used to prepare these polymers are present at the start of the process.

Optionally a photoinitiator (PI) may be added to the radiation curable aqueous coating compositions of the invention to assist radiation curing, especially if curing is by UV radiation. However, for example, if curing is to be achieved by electron beam (EB) then a PI may not be needed. Preferably, the radiation curable aqueous coating composition of the invention comprises a photo-initiator and UV-radiation is applied to obtain a cured coating.

In one embodiment the radiation curable aqueous coating composition and/or coatings of the invention contains tin in amount of preferably at most 50 ppm, more preferably at most 10 ppm, even more preferably at most 5 ppm, even more preferably at most 2 ppm; and the radiation curable aqueous coating composition and/or coatings of the invention contains organic solvent in an amount of preferably at most 5000 ppm, more preferably at most 3000 ppm, even more preferably at most 1000 ppm, even more preferably at most 500 ppm. The radiation curable aqueous coating composition and/or coatings of the invention are more preferably free of tin and/or organic solvent and even more preferably free of tin and organic solvent. The PUDs of the present invention are suitable for use in preparing coatings applied by any means, however in one preferred embodiment the coatings of the invention are applied by a means other than electro-deposition.

The wt. amount of component (a) (polyurethane-urea polymer) is the sum of the wt. amounts of the components used to prepare the polyurethane-urea polymer. The polyurethane prepolymer is preferably obtained by the reaction of the polymer precursors (a1), (a2A), (a2B) and (a3) and optionally (a2C) and optionally (a2D).

Component a—Polyurethane-Urea Polymer (a) (i) Amount of Acryloyl Groups

The polyurethane-urea polymer used to prepare the PUDs of the present invention comprises acryloyl groups in an amount of at least 2.0 mmol per g of polyurethane-urea polymer and preferably in an amount of at most 8.0 mmol per g of polyurethane-urea polymer, more preferably in an amount of at most 7.0 mmol per g of polyurethane-urea polymer and even more preferably in an amount of at most 6.5 mmol per g of polyurethane-urea polymer. The polyurethane-urea polymer used to prepare the PUDs of the present invention preferably comprises acryloyl groups in an amount of at least 2.5 mmol per g of polyurethane-urea polymer and preferably in an amount of at most 8.0 mmol per g of polyurethane-urea polymer, more preferably in an amount of at most 7.0 mmol per g of polyurethane-urea polymer and even more preferably in an amount of at most 6.5 mmol per g of polyurethane-urea polymer. The polyurethane-urea polymer used to prepare the PUDs of the present invention more preferably comprises acryloyl groups in an amount of at least 3.0 mmol per g of polyurethane-urea polymer and preferably in an amount of at most 8.0 mmol per g of polyurethane-urea polymer, more preferably in an amount of at most 7.0 mmol per g of polyurethane-urea polymer and even more preferably in an amount of at most 6.5 mmol per g of polyurethane-urea polymer. The polyurethane-urea polymer used to prepare the PUDs of the present invention more preferably comprises acryloyl groups in an amount of at least 3.5 mmol per g of polyurethane-urea polymer and preferably in an amount of at most 8.0 mmol per g of polyurethane-urea polymer, more preferably in an amount of at most 7.0 mmol per g of polyurethane-urea polymer and even more preferably in an amount of at most 6.5 mmol per g of polyurethane-urea polymer. The polyurethane-urea polymer used to prepare the PUDs of the present invention more preferably comprises acryloyl groups in an amount of at least 4.0 mmol per g of polyurethane-urea polymer and preferably in an amount of at most 8.0 mmol per g of polyurethane-urea polymer, more preferably in an amount of at most 7.0 mmol per g of polyurethane-urea polymer and even more preferably in an amount of at most 6.5 mmol per g of polyurethane-urea polymer.

(a) (ii) Amount of Urea Groups

The polyurethane-urea polymer used to prepare the PUDs of the present invention comprises urea groups in an amount of at least 0.35 and preferably in an amount of at most 3.0 milli-equivalents (meq) per g of the polyurethane-urea polymer. The polyurethane-urea polymer used to prepare the PUDs of the present invention preferably comprises urea groups in an amount of at least 0.5 and preferably in an amount of at most 3.0 milli-equivalents (meq) per g of the polyurethane-urea polymer. The polyurethane-urea polymer used to prepare the PUDs of the present invention preferably comprises urea groups in an amount of at least 0.7 and preferably in an amount of at most 3.0 milli-equivalents (meq) per g of the polyurethane-urea polymer. The polyurethane-urea polymer used to prepare the PUDs of the present invention preferably comprises urea groups in an amount of at least 1.0 and preferably at most 3.0 milli-equivalents (meq) per g of the polyurethane-urea polymer.

(a) Ratio of NCO to OH

The polyurethane-urea polymers used to prepare the PUDs present in the radiation curable aqueous coating composition of the present invention are obtained by (I) the reaction of at least the following polyurethane precursors: at least one polyisocyanate (a1), two or more polyols (a2) and at least one isocyanate reactive compound (a3) to obtain a polyurethane prepolymer, whereby the polyurethane precursors are present in an amount such that the total amount of isocyanate (NCO) and hydroxyl (OH) groups thereon are in a respective mole ratio (NCO to OH) of at least 1.35, preferably at least 1.4, more preferably 1.5, most preferably 1.6, and (II) by reacting the polyurethane prepolymer with an active hydrogen chain extending compound and optionally with water to obtain the polyurethane-urea polymer (a).

Usefully the total amount of isocyanate (NCO) and hydroxyl (OH) groups present on the polymer precursors (a1), (a2) and (a3) is such that the mole ratio of NCO to OH is no more than 4.0, more usefully no more than 3.5, most usefully no more than 2.4 for example no more than 2.2. Conveniently the total amount of isocyanate (NCO) and hydroxyl (OH) groups present on the polymer precursors (a1), (a2) and (a3) is such that the mole ratio of NCO to OH from 1.35 to 4.0, more conveniently no more than 1.4 to 3.5 and most conveniently from 1.5 to 2.4, for example from 1.6 to 2.2.

In one embodiment of the aqueous coating compositions of the invention the respective ratio of the total moles of isocyanate (NCO) groups on polyisocyanate of component (a1) to the total moles of OH groups on all of the polyols of components (a2) is preferably from 1.35 to 4.0, more preferably from 1.4 to 3.5.

In another embodiment all the polymer precursors other than polyisocyanate (a1) used to prepare the polyurethane-urea polymer (a) (such as (a2) and (a3) are free of NCO groups.

In yet another embodiment all the polymer precursors other than the polyols (a2) used to prepare the polyurethane-urea polymer (a) (such as (a1) and (a3)) are free of OH groups.

Component a1—Polyisocyanate

Preferably the amount of polyisocyanates (a1) is from 20 to 60%, more preferably from 35 to 50% by weight of the total amount of components (a) and (b). Usefully component (a1) comprises isophorone diisocyanate (also referred to as IPDI or (isocyanatomethyl)-1,3,3-trimethyl-cyclohexane). Conveniently component (a1) comprises IPDI in an amount of at least 30 parts by weight, more conveniently ≥50 parts by weight, most conveniently 70 parts by weight where the total weight of component (a1) is 100 parts by weight.

Component a2—Polyols

Component a2A—Anionic Polyol A

Preferably the amount of Anionic Polyol A (component (a2A)) is from 2 to 10%, more preferably from 3 to 7% by weight of the total amount of components (a) and (b). The Anionic Polyol A comprises at least one anionic or potentially anionic dispersing group. As used herein, potentially anionic dispersing group means a group which under the relevant conditions can be converted into an anionic group by salt formation. Usefully the Anionic Polyol A comprises a $C_{1-10}$hydrocarbo linear moiety with at least two hydroxy groups thereon and optionally one or more carboxy groups (or derivatives thereof) thereon, more usefully the Anionic Polyol A comprises a $C_{1-10}$hydrocarbo linear moiety with two hydroxy groups, more usefully the Anionic Polyol A is dimethylol propionic acid (DMPA) and/or derivatives thereof (e.g. salts).

The Anionic Polyol A (component (a2A)) may have a glass transition temperature (Tg) (e.g. measured as described herein by DSC) within a wide range and for example may have a Tg higher than preferred herein for Polyether Polyol B and/or High MW NCO-Reactive Polyol C.

Component a2B—Polyether Polyol B

The Polyether Polyol B (component (a2B)) may be linear for example may comprise a linear polyether diol preferably with a hydroxyl value above 56 mg KOH/g, more preferably above 100 mg KOH/g. Preferably the amount of Polyether Polyol B (component (a2B)) is from 3.5 to 20%, more preferably from 5 to 15% by weight of the total amount of components (a) and (b). Usefully the Polyether Polyol B has a number average molecular weight (Mn) of greater than or equal to 500 Daltons and less than or equal to 2000 Daltons. Preferably, the Polyether Polyol B has a number average molecular weight (Mn) 600 Daltons. Advantageously the Polyether Polyol B has a number average molecular weight (Mn) of less than or equal to 1500 Daltons, more advantageously ≤1200 Daltons. Conveniently the Polyether Polyol B has a number average molecular weight (Mn) from 500 to 1500 Daltons, more conveniently from 600 to 1200 Daltons. The number average molecular weight is determined by multiplying the OH functionality of the polyol by the equivalent weight of the polyol. The OH functionality of the polyol is given by the supplier of the polyol. In case the polyol is a diol, the OH functionality is 2. The equivalent weight of the polyol is calculated by dividing 56100 by the OH number of the polyol. The OH number of the polyol is measured by titration a known mass of polyol according to ASTM D4274 and is expressed as mg KOH/g.

Preferred Polyether Polyols B are polyether diols that preferably comprise polyalkyeneglycol (such as polypropyleneglycol (PPG) and/or polyethyleneglycol (PEG)); polytetrahydrofuran (also known as polyTHF, pTHF, polytetramethylene ether glycol and/or PTMEG); and/or any of those class of polyether diols available commercially from DuPont under the trade mark Cerenol™. Usefully Polyether Polyol B is selected from the group consisting of PPG, PEG, pTHF and mixtures thereof, more usefully PPG and/or pTHF, most usefully pTHF and for example those grades of pTHF available commercially (e.g. from BASF) under the trade designations pTHF650, pTHF1000 and/or pTHF2000 where the number suffixes indicate the approximate number average molecular weight (Mn) of each pTHF in daltons. According to the literature pTHF 650 has a Tg of about −81° C. and pTHF1000 and pTHF2000 both have a Tg of about −77° C. Conveniently any of these polyether polyols may also be diols and/or be linear.

Preferred Polyether Polyol B (component (a2B)) have a glass transition temperature (Tg) (e.g. measured as described herein by DSC) of less than minus 30° C., usefully less than minus 45° C., more usefully less than minus 55° C. and most usefully less than minus 70° C.

Component a2C—High MW NCO-Reactive Polyol C

Preferably the amount of the optional High MW NCO-Reactive Polyol C (component (a2C)) is up to 10% by weight of the total amount of components (a) and (b). Usefully the High MW NCO-Reactive Polyol C is present in an amount of at least a trace amount, more preferably at least 0.1%, most preferably at least 0.2% by weight of the total amount of components (a) and (b). Conveniently the High MW NCO-Reactive Polyol C is present in an amount of from a trace amount to 20%, more conveniently from 0.1% to 20%, most conveniently from 0.2% to 10% by weight of the total amount of components (a) and (b). Usefully the High MW NCO-Reactive Polyol C has a number average molecular weight (Mn) of ≥700 Daltons. Advantageously the High MW NCO-Reactive Polyol C has a number average molecular weight (Mn) of less than or equal to 2000 Daltons, more advantageously ≤1500 Daltons. Conveniently the High MW NCO-Reactive Polyol C has a number average molecular weight (Mn) from 500 to 2000 Daltons, more conveniently from 700 to 1500 Daltons. Preferred High MW NCO-Reactive Polyols C are High MW NCO-Reactive diols. The number average molecular weight is determined as described above. In one embodiment of the present invention it is preferred that the High MW NCO-Reactive Polyol C (component (a2C)) is substantially free of, preferably free of, any acryloyl functional groups that are capable of being copolymerized in the curing reaction. As used herein a trace amount denotes an amount of an ingredient which is sufficient to be detected by conventional analytical means and which also imparts properties due to the presence of the ingredient that are sufficient to be detected in the resultant composition (compared to an otherwise identical composition without that ingredient).

Component a2D—Low MW NCO-Reactive Polyol C

Preferably the amount of the optional Low MW NCO-Reactive Polyol D of component (a2D) is up to 10%, more preferably ≤5% by weight of the total amount of components (a) and (b). Usefully the Low MW NCO-Reactive Polyol D is present in an amount of at least 0.1%, more preferably at least 0.5%, most preferably at least 1% by weight of the total amount of components (a) and (b). Conveniently the Low MW NCO-Reactive Polyol D is present in an amount of from 0.1% to 20%, more conveniently from 0.5% to 10%, most conveniently from 1% to 5% by weight of the total amount of components (a) and (b). Usefully the low MW NCO-Reactive Polyol D has a number average molecular weight (Mn) of at least 50, more usefully ≥100 Daltons. Advantageously the Low MW NCO-Reactive Polyol D has a number average molecular weight (Mn) of less than 500 Daltons, more advantageously ≤400, most advantageously ≤350 Daltons. The number average molecular weight is determined as described above.

Conveniently the Low MW NCO-Reactive Polyol D has a number average molecular weight (Mn) from 50 to 400 Daltons, more conveniently from 100 to 350 Daltons. In one embodiment of the present invention it is strongly preferred that the Low MW NCO-Reactive Polyol D of component (a2D) comprises hexane diol which may also act as an extension agent.

Preferred Low MW NCO-Reactive Polyol D (component (a2D)) are diols, more preferred are short chain diols i.e. having from 1 to 10 carbon atoms and two hydroxy groups.

The Low MW NCO-Reactive Polyol D (component (a2D)) may have a glass transition temperature (Tg) (e.g. measured as described herein by DSC) within a wide range and for example may have a Tg higher than preferred herein for Polyether Polyol B and/or C.

Component a3—NCO-Reactive Component (a3) The amount of isocyanate reactive compounds is from 5 to 60% by weight of the total amount of components (a) and (b). The isocyanate reactive compounds (a3) are compounds having an average of less than 1.2 groups reactive towards isocyanate (preferably less than or equal to 1.0 NCO reactive groups) and an average of at least one acryloyl group, the compounds (a3) being other than (a2A), (a2B), (a2C) and (a2D).

The amount of NCO-Reactive component (a3) is up to 60%, preferably ≤40%, more preferably ≤30% by weight of the total amount of components (a) and (b). The NCO-Reactive Component a3 is present in an amount of at least 5%, usefully at least 10%, more usefully at least 15% by weight of the total amount of components (a) and (b). The NCO-Reactive Component a3 is present in an amount of from 5% to 60%, conveniently from 10% to 40%, more conveniently from 15% to 30% by weight of the total amount of components (a) and (b).

This NCO-Reactive Component a3 is not either of the components (a2A), (a2B), (a2C) and (a2D).

It is required that this NCO-Reactive Component has an average of less than 1.2 groups that are reactive towards isocyanate. Suitable NCO reactive groups comprise for example hydroxyl and amine groups. It will be appreciated that NCO-Reactive Component may comprise a mixture of different components, as for example Component a3 may itself be a polymeric mixture prepared by a polymerization process, so the amount of NCO reactive groups per component may be expressed as an average and will not necessarily be a integer. It will also be appreciated that it is possible that the NCO-Reactive Component may comprise a low amounts of components having more than one NCO reactive group thereon (as well as also components with no NCO-reactive groups thereon), provided that the average degree of functionality of the NCO reactive groups on Component a3 is low (<1.2). However in a preferred embodiment of the present invention the NCO-Reactive Component has an average of less than or equal to 1.0 groups that are reactive towards isocyanate and more preferably have low or no amounts (e.g. no more than 20% usefully no more than 10%, more usefully <5%, most usefully <2% by weight, for example are free) of components that comprise more than one group thereon that will react with isocyanate. Usefully the NCO-Reactive Component has an average of NCO-reactive groups from 0.5 to 0.8. When the average of NCO-reactive groups is less than 1 it will be appreciated that Component a3 may comprise a proportion of components that do not contain any NCO-reactive groups. When the average of NCO-reactive groups is 1 this comprises the alternatives that Component a3 is a mixture of components with different degrees of functionality and also where Component a3 consists of a single component with one NCO-reactive group thereon.

In one embodiment of the present invention it is strongly preferred that the NCO-Reactive Unsaturated Component a3 comprises at least 80% (more preferably at least 90%, even more preferably at least 95%, most preferably at least 98%, for example 100%) by weight of Component a3 of components that have at least one acryloyl functional group that is capable of being copolymerized in the curing reaction, and contains groups reactive towards isocyanate being present in an average degree of functionality of no more than 1.2, more preferably ≤1.0, most preferably from 0.5 to 0.8 per mole of NCO-Reactive Unsaturated Component E.

Examples of NCO-Reactive Unsaturated Component a3 are monohydroxy functional acrylic and/or acrylate monomers and/or pentaerythritol-triacrylate (PETiA).

In one embodiment of the invention the NCO-Reactive Unsaturated Component a3 comprises an acrylated compound containing one reactive group capable of reacting with isocyanate groups. This component of the present invention includes compounds comprising at least one unsaturated function such as acrylic group and one nucleophilic function capable of reacting with isocyanate, preferably an hydroxyl group. Preferred are acryloyl mono-hydroxy compounds, more particularly polyacryloyl mono-hydroxy compounds. Acrylates are particularly preferred. Useful compounds for Component a3 include the esterification products of aliphatic and/or aromatic polyols with acrylic acid having a residual average hydroxyl functionality of about 1. The partial esterification products of acrylic acid with tri-, tetra-, penta- or hexahydric polyols or mixtures thereof are also preferred. In this context, it is also possible to use reaction products of such polyols with ethylene oxide and/or propylene oxide or mixtures thereof, or reaction products of such polyols with lactones, which add to these polyols in a ring-opening reaction. Examples of suitable lactones are [gamma]-butyrolactone and, in particular [delta]-valerolactone and [epsilon]-caprolactone. These modified or unmodified polyols are partly esterified with acrylic acid, methacrylic acid or mixtures thereof until the desired residual hydroxyl functionality is reached.

Component b—NCO-Unreactive Unsaturated Component

The PUD present in the radiation curable aqueous coating composition of the invention is optionally obtained by combining the polyurethane-urea polymer (component (a)) with the optional component (b) which is a multifunctional ethylenically unsaturated compound that under the conditions of the polyurethane-urea polymer preparation reaction is substantially unreactive towards isocyanate groups (also referred to herein as NCO-Unreactive Unsaturated Component).

Where present the amount of the NCO-Unreactive Unsaturated Component a3 comprises up to 40%, preferably ≤35%, more preferably ≤30% by weight of the total amount of components (a) and (b). Where present the NCO-Unreactive Unsaturated Component a3 is present in at least a trace amount usefully in an amount of at least 0.1%, usefully at least 5%, more usefully at least 10% by weight of the total amount of components (a) and (b). Conveniently the NCO-Unreactive Unsaturated Component a3 may be present in an amount of from 0.1% to 40%, conveniently from 5% to 35%, more conveniently from 10% to 30% by weight of the total amount of components (a) and (b).

Component c—Neutralizing Agent

Any suitable neutralizing agents, like (tertiary) amines or ammonia known in the art may be suitable for use herein. In preferred aqueous coating composition of the invention the isocyanate terminated prepolymer may be neutralized with a metal salt and/or ammonia.

Active Hydrogen Chain Extending Compound

Any chain extenders known in the art may be suitable for use herein such as those described in US2007141264 for stain resistance urethane vinyl coatings on page 7 line 26 to page 8 line 12 on contents of which are hereby incorporated by reference.

The active-hydrogen chain extending compound is preferably an amino-alcohol, a primary or secondary aliphatic, alicyclic, aromatic, araliphatic or heterocyclic diamine or polyamine (i.e. having 3 or more amine groups), or hydrazine or a substituted hydrazine, or a polyhydrazide (preferably a dihydrazide).

Examples of chain extenders useful herein include ethylene diamine, diethylene triamine, triethylene tetramine, propylene diamine, butylene diamine, hexamethylene diamine, cyclohexylene diamine, piperazine, 2-methyl piperazine, phenylene diamine, toluylene diamine, xylylene diamine, tri(2-aminoethyl) amine, 3,3-dinitrobenzidine, 4,4'-diaminodiphenylmethane, methane diamine, m-xylene diamine, isophorone diamine, and adducts of diethylene triamine with acrylate or its hydrolysed products. Also materials such as hydrazine (e.g. in the form of its mono-hydrate), azines such as acetone azine, substituted hydrazines such as, for example, dimethyl hydrazine, 1,6-hexamethylene-bis-hydrazine, carbodihydrazine, dihydrazides of dicarboxylic acids and sulphonic acids such as adipic acid dihydrazide, oxalic acid dihydrazide, isophthalic acid dihydrazide, hydrazides made by reacting lactones with hydrazine such as gamma-hydroxylbutyric hydrazide, bis-semi-carbazide, and bis-hydrazide carbonic esters of glycols. Another suitable class of chain extenders is the so-called "Jeffamine" compounds with a functionality of 2 or 3 (available from Huntsman). These are polypropylene oxide (PPO) or PEO-based di or triamines, e.g. "Jeffamine" T403 and "Jeffamine" D-400.

Preferably the active-hydrogen chain extending compound is or includes hydrazine (usually in the form of its monohydrate), or a di or triamine (usually a diamine) of molecular weight below 300. Water-soluble active hydrogen chain extenders are preferred.

Water itself may be used as an indirect chain extender because it will slowly convert some of the terminal isocyanate groups of the prepolymer to amino groups (via unstable carbamic acid groups) and the modified prepolymer molecules will then undergo chain extension. However, this is very slow compared to chain extension using the active-hydrogen chain extenders.

Mc (Average Molecular Weight Between Crosslinks)

The molecular weight of moieties between crosslinks along the polymer chains can be calculated from the Mc. A low Mc is due to a large proportion of the ethylenically unsaturated groups being 'in chain C=C' and consequently a lower Mc results in a less flexible more brittle polymer. For example it is known [e.g. EP 0753531 and paragraph 0008 of US2009-0269589 (Bayer)] that epoxy acrylates produce brittle films after radiation curing. It is believed that this is due to the higher proportion of 'in chain' C=C groups.

Preferred polyurethane-urea polymers used in the present invention have an average molecular weight of the polymer regions between the crosslink bonds (denoted Mc) of greater than or equal to 50 Daltons, more preferably ≥100 Daltons, most preferably ≥150 Daltons. Advantageously the polyurethane-urea polymers have Mc of less than or equal to 750 Daltons, more advantageously ≤600 Daltons, most advantageously ≤450 Daltons. Conveniently the polyurethane-urea polymers have Mc from 50 to 750 Daltons, more conveniently from 100 to 600 Daltons, most conveniently from 150 to 450 Daltons.

Mc value is directly derived from the total amount of double bonds in a polymer so whilst this may be useful parameter to measure and control Mc value is only one optional factor which may be optionally used to achieve the objectives of the present invention.

Ratio of 'α (Alpha)-ω (Omega)' C═C Versus 'in Chain' C═C

Without wishing to be bound by any mechanism it is believed that the radiation curable coating compositions of the present invention may have a higher proportion of the ethylenically unsaturated groups located at the ends of the polymer chains (also denoted herein as 'alpha-omega' C═C and/or 'α-ω' C═C compared to ethylenically unsaturated groups which are in the middle of the polymer chains (also denoted herein as 'in chain' C═C). As the unsaturated groups are more present at the end of the polymer chain (and/or in the form of a diluent), it is believed that the resultant PUD is crosslinked in a more heterogeneous manner than prior art PUDs. Thus PUDs of the invention may comprise domains of hard polymer with a very high concentration of double bonds that are connected via flexible chains of complete saturated polyurethane. Compared to known polymers with a similar value of Mc, it is believed that PUDs of the invention will have a more pronounced separation between the crosslinked and the flexible domains which will thus additionally improve flexibility.

Therefore preferred compositions of the present invention comprise ethylenically unsaturated groups where the proportion (as measured by molar ratio) of 'alpha-omega' C═C to 'in chain' C═C is at least 1 (i.e. 'alpha-omega' C═C is in excess), more preferably the respective molar ratio (alpha-omega to in chain) is at least 3, even more preferably at least 5, most preferably at least 10. In one embodiment the compositions of the present invention are predominantly alpha-omega functional.

A further aspect of the present invention comprises a method of coating a substrate comprising the steps of
(I) applying an aqueous coating composition of the invention to a substrate to form a coating thereon
(II) exposing the coating from step (I) to radiation (such as ultraviolet radiation or electron beam radiation) to cure the coating. Preferably, the radiation applied is ultraviolet radiation.

A yet other aspect of the present invention provides a radiation cured coated substrate obtained by the coating method of the invention.

Preferably the cured coatings of the invention are sufficiently flexible to pass a bending test (as described herein) with a rod with a diameter of less than or equal to 40 mm, more preferably ≤35 mm, most preferably ≤30 mm.

The present invention further relates to a process for preparing the radiation curable aqueous coating composition according to any one of claims 1 to 10, the process comprising the steps of:
(I) reacting at least the following polyurethane precursors: a polyisocyanate (a1), two or more polyols (a2) and an isocyanate reactive compound (a3), where the total amount of isocyanate and hydroxy groups present on the polymer precursors (a1), (a2) and (a3) are in a respective mole ratio of at least 1.35, where
(a1) the amount of polyisocyanates (a1) is from 10 to 80% by weight;
(a2) the two or more polyols being an Anionic Polyol A, a Polyether Polyol B and optionally a High MW NCO-Reactive Polyol C and optionally a Low MW NCO-Reactive Polyol D where;
(a2A) the Anionic Polyol A is at least one isocyanate-reactive polyol comprising at least one anionic or potentially anionic dispersing group and where the amount of Anionic Polyol A is from 1 to 15% by weight;
(a2B) the Polyether Polyol B is at least one isocyanate reactive polyether polyol with a number average molecular weight (Mn) from 500 to 2000 Daltons, where Polyether Polyol B is other than Anionic Polyol A and where the amount of Polyether Polyol B is from 3 to 30% by weight;
(a2C) the optional High MW NCO-Reactive Polyol C is at least one isocyanate reactive polyol with a number average molecular weight (Mn) of at least 500 Daltons; where the High MW NCO-Reactive Polyol C is other than Anionic Polyol A and Polyether Polyol B and where the amount of High MW NCO-Reactive Polyol C (where present) is up to 20% by weight;
(a2D) the optional Low MW NCO-Reactive Polyol D is at least one isocyanate reactive polyol with a number average molecular weight (Mn) less than 500 Daltons; where the low MW NCO-Reactive Polyol D is other than Anionic Polyol A, Polyether Polyol B and High MW NCO-Reactive Polyol C and where the amount of Low MW NCO-Reactive Polyol D (where present) is up to 20% by weight;
(a3) the isocyanate reactive compounds are compounds having an average of less than 1.2 groups reactive towards isocyanate and an average of at least one acryloyl group, the compounds being other than (a2A), (a2B), (a2C) and (a2D) and where the amount of isocyanate reactive compound is from 5 to 60% by weight; thereby obtaining a polyurethane prepolymer
(II) adding a neutralizing agent to neutralize the polyurethane prepolymer to obtain a neutralized polyurethane prepolymer;
(III) dispersing the neutralized polyurethane prepolymer in water (i.e. by adding water to the polyurethane prepolymer from step (II) and/or adding the polyurethane prepolymer from step (II) to water) to obtain a dispersion, and
(IV) adding an active hydrogen chain extending compound to the dispersion to obtain a polyurethane-urea polymer (a) with
(i) an acryloyl functionality at least 2.0 mmol per g of the polyurethane-urea polymer; and
(ii) urea groups present in an amount of at least 0.35 milli-equivalents (meq) per g of the polyurethane-urea polymer,
whereby the process optionally further comprises mixing the product obtained from step (I), (II), (III) and/or (IV) (preferably the product obtained from step (I) and/or (IV)) with a multifunctional ethylenically unsaturated compound unreactive towards isocyanates (b) in such amount that the total amount of (b) in the radiation curable coating composition is from 0 to 40% by weight,
where the weight % of components (a1), (a2A), (a2B), (a2C), (a2D), (a3) and (b) are calculated based on the total of components (a) and (b) being 100%.

DEFINITIONS

Radiation Curing

Radiation curing (and related terms such as radiation cured and/or radiation curable) refers to a method of curing and/or polymerisation by exposing a material to radiant energy such as actinic and/or ionizing radiation. Radiation curing can be achieved with or without oxygen (air) and/or initiator.

Ionizing radiation is electromagnetic (e.g. gamma-rays or X-rays) or particulate (e.g. electron beam (EB)) radiation that is sufficiently energetic to form ions and/or radicals in the irradiated material and thus initiate polymerisation of monomers and/or cross-linking of polymers without adding photo-additive (such as photosensitizer and/or photoinitiator). Suitable sources of particulate ionizing radiation comprise; electron accelerators (such as Van der Graaff accelerators), linear accelerators, resinous transformers and radioactive materials (such as cobalt 60 or strontium 90). Electrons of energies from 50 to 300 KeV are particularly suitable. Suitable sources of electromagnetic ionizing radiation comprise any which emit radiation of wavelengths, for example, from 10-3 angstroms (Å) (=0.1 pm) to 2000 Å (=200 nm), such as X-Ray machines, vacuum ultraviolet lamps (e.g. xenon or krypton arcs).

Actinic radiation denotes ultraviolet (UV) or visible light (preferably predominantly in the ultra-violet region) that will initiate substantial cross-linking and/or polymerisation only when irradiation occurs in the presence of a photo-additive (photosensitizer and/or photoinitiator). Suitable sources of actinic radiation have wavelengths less than 700 nanometers, preferably from 180 to 440 nanometres, more preferably from 200 to 400 nm, and can be produced by commercially available UV sources such as mercury vapor lamps, mercury arc lamps, carbon arc lamps, tungsten filament lamps, sun lamps and lasers (such as He—Cd and Ar).

As a short hand radiation-curing is also referred to herein as UV and/or EB curing where UV curing can be considered to represent radiation curing by any actinic radiation of compositions where photo-additive is present and EB curing can be considered to represent radiation curing by any ionizing radiation of compositions where photo-additive is absent.

The amount of radiation necessary to cure a given coating composition depends on many factors such as the angle of exposure to the radiation, the thickness of the coating, the speed of passage past the radiation source, the amount of polymerisable groups in the composition, and the presence or absence of photo-additive. For any given composition, routine experimentation is the best method of determining the amount and duration of the radiation required to fully cure a coating. However typically UV curing may be effected at a dose of from 0.2 to 1.0 J/cm2, for example 0.4 J/cm2.

Test Methods

Unless otherwise indicated all the tests herein are carried out under standard conditions as defined herein.

Assessment of Coating

Where indicated in some of the above tests, the performance of a coating can be assessed by assessing the damage to the coating. Damage is preferably assessed either by measuring the weight percentage of the coating left on the substrate after the test but the coating can also be evaluated visually using the rating scale below where 5 is the best and 1 is the worst:

5=very good: no visible damage or degradation/discoloration;
4=only slight visible damage or haze/blooming;
3=clear damage or haze/blooming;
2=coating partially dissolved/damaged;
1=very poor; coating is completely dissolved/damaged Many other variations embodiments of the invention will be apparent to those skilled in the art and such variations are contemplated within the broad scope of the present invention.

Further aspects of the invention and preferred features thereof are given in the claims herein.

EXAMPLES

The present invention will now be described in detail with reference to the following non limiting examples which are by way of illustration only.

As can be seen in the working and comparative example the application results are significantly better for the lower molecular weight diol although the overall concentration soft polymeric diol is similar.

Components and Abbreviations Used:
IPDI=Isophorone diisocyanate available from Bayer
HDI=Hexamethylene diisocyanate from Bayer
DMPA=Dimethylolpropionic acid available from Perstorp polyols
PolyTHF650=Polytetramethylene ether glycol, OH-number=170 mg KOH/g available from BASF
PolyTHF1000=Polytetramethylene ether glycol, OH-number=112.5 mg KOH/g available from BASF
PolyTHF2900=Polytetramethylene ether glycol, OH-number=39 mg KOH/g available from Mitsubishi Chemical Europe
TEA=triethylamine supplied by Arkema
Peta=pentaerytritoltriacrylate Agisyn 2884, OH-number=115 mg KOH/g, available from AGI
PET5PO3A=Etermer 2321, OH-number=87.5 mg KOH/g, available from Eternal
DiTMPTA=Agisyn 2887, OH-number=122 mg KOH/g, available from AGI
HEA=2-hydroxyethyl acrylate available from ECEM European Chemical Marketing by
HEMA=2-hydroxyethyl metacrylate available from Evonik
BHT=butylated hydroxyl toluene available from Brenntag
Hydrazine=Hydrazine hydrate available from Arkema
TMP3EOTA=Agisyn 2838 available from AGI
Disponyl AFX4030=Nonionic surfactant available from BASF
Ionol cp=2,6-Di-tert-butyl-4-methylphenol available from Brenntag
Dabco T-9=tin catalyst supplied by AirProducts

Example 1

Preparation of a Polyurethane Dispersion

A 2000 cm$^3$ flask equipped with a thermometer and overhead stirrer was charged with components DMPA (27.0 g), pTHF650 (60.0 g), PetiA (283.5 g), IPDI (188.04 g), HDI (20.9) and Ionol cp (0.64 g). The reaction was heated to 50° C. Then 0.08 g of Dabco T-9 was added. After the exotherm was complete the reaction was kept at 85° C. for 120 minutes. The NCO content of the resultant isocyanate-terminated prepolymer was 5.5% (Theoretically 5.6%). The prepolymer was cooled down to 80° C. and TEA was added (20.4 g).

A dispersion of the resultant isocyanate-terminated prepolymer was made by feeding 517 g of the resulting prepolymer mixture in 30 minutes to deionized water (921.4 g) containing AFX4030 (16.7 g).

The dispersion temperature was controlled between 25 to 35° C. Hydrazine (14.7 g) was added after the feed was completed.

Table 1. For Example 4, 10 wt % (relative to the solid content of the dispersion) TMP3EOTA is added to example 2. Unless specified otherwise, the amounts of the different components are expressed in grams. The properties of the resulting compositions are represented in Tables 2 and 3.

TABLE 1

|  |  | Comp. Ex. 1 | Comp. ex. 1 | Ex 2 | Ex 3 | Comp. ex 2 | Comp. ex 3 |
|---|---|---|---|---|---|---|---|
| IPDI | a1 | 188.0 | 188.0 | 157.7 | 222.4 | 285.1 | 289.2 |
| HDI | a1 | 20.9 | 20.9 | 17.5 |  | 31.7 | 32.1 |
| DMPA | a2A | 27.0 | 27.0 | 27.0 | 27.0 | 30.0 | 30.0 |
| pTHF650 | a2B | 60.0 |  | 48.0 |  | 138.0 | 145.0 |
| pTHF1000 | a2B |  |  |  | 90 |  |  |
| pTHF2900 | — |  | 60.0 |  |  |  |  |
| PETA* | a3 | 283.5 | 303.0 |  |  |  |  |
| PET5PO3A | a3 |  |  | 348.8 |  |  |  |
| DiTMPTA | a3 |  |  |  | 254.7 |  |  |
| HEA | a3 |  |  |  |  |  | 102 |
| HEMA | a3 |  |  |  |  | 114 |  |
| BHT |  | 0.64 | 0.64 | 0.64 | 0.64 | 0.96 | 0.96 |
| Dabco T-9 |  | 0.08 | 0.08 | — | — | 0.16 | 0.16 |
| TEA | c | 20.4 | 20.4 | 20.4 | 20.4 | 22.6 | 22.6 |
| Neutralised PU prepolymer |  | 517 | 517 | 517.0 | 517.0 | 519.0 | 519.0 |
| Water |  | 848.6 | 849.5 | 895.2 | 921.6 | 932.8 | 933.7 |
| AFX4030 |  | 16.7 | 16.7 | 16.7 | 16.7 | 16.7 | 16.7 |
| Hydrazine | d | 14.7 | 16.2 | 8.5 | 13.3 | 21.4 | 21.7 |

*PETA is a combination of pentaerytritoltriacrylate and pentaerytritoltetraacrylate. The hydroxyl value of PETA used to prepare the above examples was 116 mg KOH/g. This was used to determine the respective ratio of pentaerytritoltriacrylate to pentaerytritoltetraacrylate in the PETA used in Table 1 as 62:38.

The resultant polyurethane dispersion had the following specifications: a sediment content of 0.02%, a pH of 7.4 and a brookfield viscosity at 25° C. of 14 mPas (measured at 25° C. with a Brookfield LVT viscometer using spindle nr. 1 at 30 rpm).

Comparative Example 1

Preparation of a Polyurethane Dispersion

A 2000 cm³ flask equipped with a thermometer and overhead stirrer was charged with components DMPA (27.0 g), pTHF2900 (60.0 g), PetA (303.0 g), IPDI (188.04 g), HDI (20.9) and Ionol cp (0.64 g). The reaction was heated to 50° C. Then 0.08 g of Dabco T-9 was added. After the exotherm was complete the reaction was kept at 85° C. for 120 minutes. The NCO content of the resultant isocyanate-terminated prepolymer was 6.0% (Theoretically 6.0%). The prepolymer was cooled down to 80° C. and TEA was added (20.4 g).

A dispersion of the resultant isocyanate-terminated prepolymer was made by feeding 517 g of the resulting prepolymer mixture in 30 minutes to deionized water (921.4 g) containing AFX4030 (16.7 g).

The dispersion temperature was controlled between 25 to 35° C. Hydrazine (16.2 g) was added after the feed was completed.

The resultant polyurethane dispersion had the following specifications: a sediment content of 0.03%, a pH of 7.8 and a Brookfield viscosity at 25° C. of 16 mPas (measured at 25° C. with a Brookfield LVT viscometer using spindle nr. 1 at 30 rpm).

In example 2 to 4 and comparative example 2 and 3 the process described in example 1 was repeated except that different quantities and different constituents were used. These quantities and components are specified below in

TABLE 2

|  | Ex. 1 | Comp. ex. 1 | Ex 2 | Ex 3 | Comp. ex 2 | Comp. ex 3 | Ex 4 |
|---|---|---|---|---|---|---|---|
| pH | 7.4 | 7.8 | 7.9 | 7.6 | 7.6 | 7.4 | 7.6 |
| Sediment [%] | 0.02 | 0.03 | <0.05 | 0.2 | 0.05 | 0.05 | <0.05 |
| Viscosity [mPas] | 14 | 16 | 61 | 12 | 50 | 42 | 84 |
| Acryloyl functionality (mmol/g polyurethane urea polymer) | 5.1 | 5.3 | 3.0 | 3.1 | 0 | 1.5 | 3.0 |
| NCO % prepolymer [%] | 5.46 | 6.04 | 3.17 | 5.01 | 8.00 | 8.11 | 3.17 |
| NCO/OH [—] | 1.7 | 1.8 | 1.5 | 1.8 | 1.7 | 1.7 | 1.5 |
| Urea content [meq/g polyurethane urea polymer] | 1.24 | 1.36 | 0.71 | 1.11 | 1.76 | 1.78 | 0.71 |

The PUDs prepared as described herein were applied as coatings and cured by UV radiation and the stain resistance and flexibility of the cured coatings were tested as described below. The results are presented in Table 3.

Flexibility

The polyurethane binders were formulated with 3% of a photoinitiator (Irgacure 2959), 1.75% of deuteron MK, 1.45% of Acematt TS-100 and 0.6% of BYK348. The formulated coating was applied with a wire rod on a non-porous very flexible PVC substrate (36 micron wet). The coating was dried for 1 min @ 150 deg C. (surface temperature is 100 deg C.) and then cured under UV light (240 nm) of 80 Watt/cm at 12-14 m/min. belt speed. To measure the flexibility the coated substrate was winded around rods with varying diameters [10, 20, 30 & 40] at room temperature. The coated substrate is coloured with a water-based black marker during bending so any cracks can be more easily seen. After the substrate is unwound the coated substrate is cleaned with a tissue and any potential cracks will remain black. A coating is deemed to pass the bending test if it can be bent around a rod of a given diameter and unwound without showing any cracks. The smaller the diameter rod which passes the test the more flexible the coating.

When the coating passed the winding tests around a 30 mm rod with no cracks visible it is expected that the coating is suitable for application on flexible substrates.

Stain Resistance

To measure the stain resistance, the coating was applied on a white PVC substrate (36 micron wet). The coating was dried for 1 min @ 150 deg C. (surface temperature is 100 deg C.) and then cured under UV light (240 nm) of 80 Watt/cm at 12-14 m/min. belt speed. The resistances are tested by exposing the coated substrate to several test substances, covered by a microscope glass and left for 24 hours. After 24 hours, the solvent is removed and the substrate is cleaned with first water and subsequently isopropanol. The tested chemicals are red alcohol marker, brown shoe polish, SB 670 colorant in white spirit, SG146 colorant in white spirit, E316 red colorant in water, betadine and B807 blue colorant in alcohol. After exposure the substrate is washed with isopropanol. The remaining stains are assessed visually using 1-5 scale, 5=best.

TABLE 3

| | FLEX Ø10 mm | FLEX Ø20 mm | FLEX Ø30 mm | FLEX Ø40 mm | Red alcohol Marker | Shoe Polish | SB 670 in white spirit | SG146 in white spirit | E316 red in water | Betadine | B807 in alcohol | total |
|---|---|---|---|---|---|---|---|---|---|---|---|---|
| Ex. 1 | Fail | Pass | Pass | Pass | 3 | 4 | 4 | 2 | 4 | 3 | 3 | 23 |
| Comp1. | Fail | Fail | Fail | Fail | 1 | 1 | 0 | 0 | 1 | 1 | 1 | 5 |
| Ex. 2 | Pass | Pass | Pass | Pass | 4 | 5 | 4 | 3 | 2 | 2 | 2 | 22 |
| Ex. 3 | Pass | Pass | Pass | Pass | 5 | 5 | 4 | 3 | 2 | 2 | 2 | 23 |
| Ex. 4 | Fail | Fail | Pass | Pass | 4 | 4 | 4 | 3 | 1 | 2 | 2 | 20 |
| Comp. 2 | Pass | Pass | Pass | Pass | 3 | 3 | 2 | 1 | 0 | 1 | 1 | 11 |
| Comp. 3 | Pass | Pass | Pass | Pass | 3 | 4 | 2 | 1 | 0 | 1 | 1 | 12 |

The described water based UV curable dispersions results in cured coatings which exhibit a superior balance in chemical resistance and flexibility though the PUDs of the invention have a high crosslink density after cure and prepared from a relative low amount of flexible polyols with a molecular weight below 2000 g/mol. Especially comparison of Example 1 with Comparative Example 1 obtained with exactly the same components except for the polyols shows the benefit of the compositions according to this invention.

The invention claimed is:

1. A radiation curable aqueous coating composition comprising a dispersion of a chain extended polyurethane which dispersion comprises
    (a) a polyurethane-urea polymer comprising:
        (i) acryloyl groups present in an amount of at least 2.0 mmol per g of the polyurethane-urea polymer; and
        (ii) urea groups present in an amount of at least 0.35 milli-equivalents (meq) per g of the polyurethane-urea polymer;
    (b) optionally a multifunctional ethylenically unsaturated compound unreactive towards isocyanates, in an amount, when present, of up to 40% by weight of components (a) and (b); and
    (c) a neutralizing agent; wherein
    the polyurethane-urea polymer (component (a)) is obtained by (I) the reaction of at least the following polyurethane precursors: at least one polyisocyanate (a1), two or more polyols (a2) and at least one isocyanate reactive compound (a3) to obtain a polyurethane prepolymer, wherein the isocyanate and hydroxy groups on the polymer precursors (a1), (a2) and (a3) are present in a respective mole ratio (NCO to OH) of at least 1.35, and (II) by neutralizing the polyurethane prepolymer and reacting the neutralized polyurethane prepolymer with an active hydrogen chain extending compound and optionally with water to obtain the polyurethane-urea polymer (a), wherein
    (a1) the amount of polyisocyanates (a1) is from 10 to 80% by weight;
    (a2) the two or more polyols being an anionic polyol A, a polyether polyol B and optionally a high MW NCO-reactive polyol C and optionally a low MW NCO-reactive polyol D, wherein
        (a2A) the anionic polyol A is at least one isocyanate-reactive polyol comprising at least one anionic or potentially anionic dispersing group, and wherein the amount of the anionic polyol A is from 1 to 15% by weight;
        (a2B) the polyether polyol B is at least one isocyanate reactive polyether polyol with a number average molecular weight (Mn) from 500 to 2000 Daltons, wherein the polyether polyol is other than the anionic polyol A and wherein the amount of the polyether polyol B is from 3 to 30% by weight;
        (a2C) the optional high MW NCO-reactive polyol C is at least one isocyanate reactive polyol with a number average molecular weight (Mn) of at least 500 daltons, wherein the high MW NCO-reactive polyol C is other than the anionic polyol A and the polyether polyol B and wherein the amount of high MW NCO-reactive polyol C when present is up to 20% by weight;
        (a2D) the optional low MW NCO-reactive polyol D is at least one isocyanate reactive polyol with a number average molecular weight (Mn) less than 500 daltons, wherein the low MW NCO-reactive polyol D is other than the anionic polyol A, the polyether polyol B and the high MW NCO reactive polyol C, and wherein the amount of the low MW NCO-reactive polyol D when present is up to 20% by weight;
    (a3) the isocyanate reactive compounds are compounds having an average of less than 1.2 groups reactive towards isocyanate and an average of at least one acryloyl group, the compounds being other than (a2A), (a2B), (a2C) and (a2D), and wherein the amount of the isocyanate reactive compound is from 5 to 60% by weight; wherein
    the weight % of components (a1), (a2A), (a2B), (a2C), (a2D), (a3) and (b) are calculated based on the total of components (a) and (b) being 100%.

2. The radiation curable aqueous coating composition according to claim 1, wherein the polyurethane-urea polymer comprises acryloyl groups in an amount of at least 2.5 mmol per g of the polyurethane-urea polymer.

3. The radiation curable aqueous coating composition according to claim 1, wherein the polyurethane-urea polymer comprises acryloyl groups in an amount of at least 3.0 mmol per g of the polyurethane-urea polymer.

4. The radiation curable aqueous coating composition according to claim 1, wherein the dispersion comprises at least one multifunctional ethylenically unsaturated compound unreactive towards isocyanates (component (b)), in an amount of at least 5% by weight of components (a) and (b).

5. The radiation curable aqueous coating composition according to claim 1, wherein the polyether polyol B (a2B) is at least one isocyanate reactive polyether polyol with a number average molecular weight (Mn) from 500 to 1200 daltons.

6. The radiation curable aqueous coating composition according to claim 1, wherein the NCO/OH ratio is at least 1.5.

7. The radiation curable aqueous coating composition according to claim 1, wherein the neutralizing agent is a metal salt and/or ammonia.

8. The radiation curable aqueous coating composition according to claim 1, wherein the resulting coating composition is tin-free.

9. The radiation curable aqueous coating composition according to claim 1, wherein the resulting coating composition is solvent-free.

10. The radiation curable aqueous coating composition according to claim 1, which further comprises a photoinitiator.

11. The radiation curable aqueous coating composition according to claim 4, wherein the at least one multifunctional ethylenically unsaturated compound unreactive towards isocyanates (component (b)) is present in an amount of at least 10% by weight of components (a) and (b).

12. A method of coating a substrate and/or an article comprising the steps of:
(I) applying the radiation curable coating composition according to claim 1 to a substrate and/or an article to form a coating thereon;
(II) exposing the coating from step (I) to radiation to cure the coating.

13. The method according to claim 12, wherein the radiation is ultraviolet radiation.

14. A substrate and/or article coated by the radiation curable aqueous coating composition according to claim 1.

15. A process for preparing the radiation curable aqueous coating composition according to claim 1, wherein the process comprises the steps of:
(I) forming a polyurethane prepolymer by reacting polyurethane precursors comprising a polyisocyanate (a1), two or more polyols (a2) and an isocyanate reactive compound (a3), wherein the total amount of isocyanate and hydroxy groups present on the polymer precursors (a1), (a2) and (a3) are in a respective mole ratio of at least 1.35, wherein
  (a2) the amount of polyisocyanates (a1) is from 10 to 80% by weight;
  (a2) the two or more polyols comprise an anionic polyol A, a polyether polyol B, optionally a high MW NCO-reactive polyol C and optionally a low MW NCO-reactive polyol D, wherein
    (a2A) the anionic polyol A is at least one isocyanate-reactive polyol comprising at least one anionic or potentially anionic dispersing group, wherein the amount of the anionic polyol A is from 1 to 15% by weight;
    (a2B) the polyether polyol B is at least one isocyanate reactive polyether polyol with a number average molecular weight (Mn) from 500 to 2000 daltons, wherein the polyether polyol B is other than the anionic polyol A, and wherein the amount of the polyether polyol B is from 3 to 30% by weight;
    (a2C) the optional high MW NCO-reactive polyol C is at least one isocyanate reactive polyol with a number average molecular weight (Mn) of at least 500 daltons, wherein the high MW NCO-reactive polyol C is other than the anionic polyol A and the polyether polyol B, and wherein the amount of high MW NCO-reactive polyol C when present is up to 20% by weight;
    (a2D) the optional low MW NCO-reactive polyol D is at least one isocyanate reactive polyol with a number average molecular weight (Mn) less than 500 daltons, wherein the low MW NCO-reactive polyol D is other than the anionic polyol A, the polyether polyol B and the high MW NCO-reactive polyol C, and wherein the amount of the low MW NCO-reactive polyol D when present is up to 20% by weight;
  (a3) the isocyanate reactive compounds are compounds having an average of less than 1.2 groups reactive towards isocyanate and an average of at least one acryloyl group, the compounds being other than (a2A), (a2B), (a2C) and (a2D), wherein the amount of the isocyanate reactive compound is from 5 to 60% by weight;
(II) adding a neutralizing agent to neutralize the polyurethane prepolymer to obtain a neutralized polyurethane prepolymer;
(lll) dispersing the neutralized polyurethane prepolymer in water to obtain a dispersion, and
(IV) adding an active hydrogen chain extending compound to the dispersion to obtain a polyurethane-urea polymer (a) with
  (i) an acryloyl functionality at least 2.0 mmol per g of the polyurethane-urea polymer; and
  (ii) urea groups present in an amount of at least 0.35 milli-equivalents (meq) per g of the polyurethane-urea polymer, wherein
the process optionally further comprises mixing the product obtained from step (I), (II), (lll) and/or (IV) with a multifunctional ethylenically unsaturated compound unreactive towards isocyanates (b) in an amount of 0 to 40% by weight, and wherein
the weight % of components (a1), (a2A), (a2B), (a2C), (a2D), (a3) and (b) are calculated based on the total of components (a) and (b) being 100%.

* * * * *